United States Patent [19]

Hirose et al.

[11] 4,265,730
[45] May 5, 1981

[54] SURFACE TREATING APPARATUS UTILIZING PLASMA GENERATED BY MICROWAVE DISCHARGE

[75] Inventors: Masahiko Hirose; Yoshimi Akai, both of Yokohama, Japan

[73] Assignee: Tokyo Shibaura Denki K.K., Kawasaki, Japan

[21] Appl. No.: 134,502

[22] Filed: Mar. 27, 1980

[30] Foreign Application Priority Data

Mar. 30, 1979 [JP] Japan .................. 54/38215

[51] Int. Cl.³ .................. C23C 15/00; B01J 19/00
[52] U.S. Cl. .................. 204/298; 156/345; 204/192 E; 250/531
[58] Field of Search .................. 204/164, 192E, 298; 156/345, 643; 250/531; 427/38, 39

[56] References Cited

U.S. PATENT DOCUMENTS

| | | | |
|---|---|---|---|
| 4,017,404 | 4/1977 | Habeger | 250/531 |
| 4,065,369 | 12/1977 | Ogawa et al. | 204/164 |
| 4,101,411 | 7/1978 | Suzuki et al. | 204/298 |
| 4,138,306 | 2/1979 | Niwa | 156/345 |
| 4,160,690 | 7/1979 | Shibagaki et al. | 156/643 |
| 4,175,235 | 11/1979 | Niwa et al. | 250/542 |

*Primary Examiner*—Aaron Weisstuch
*Attorney, Agent, or Firm*—Oblon, Fisher, Spivak, McClelland & Maier

[57] ABSTRACT

Disclosed is an apparatus for treating the surface of a material in a gas plasma generated by microwave discharge. The apparatus comprises a microwave generator, a waveguide for transmitting the microwave generated from the microwave generator, a closed vessel housing a material to be treated, means for introducing a gas into the closed vessel, means for withdrawing the gas from the closed vessel, an antenna means inserted at least partially into the closed vessel, said antenna means serving to pick up the microwave from the waveguide and to deliver said microwave into the closed vessel for producing a gas plasma, and a cylindrical body formed of a microwave-transmitting material, mounted to the closed vessel in an air-tight fashion, and surrounding the antenna means at the portion inserted into the closed vessel.

10 Claims, 1 Drawing Figure

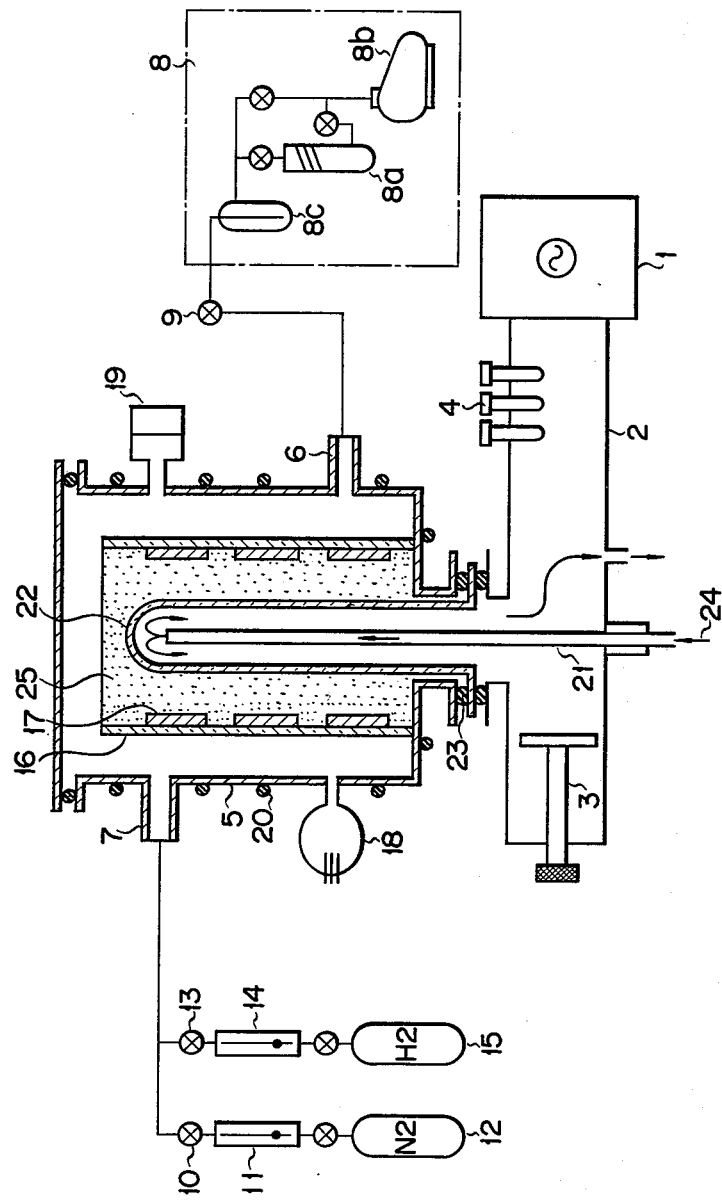

SURFACE TREATING APPARATUS UTILIZING PLASMA GENERATED BY MICROWAVE DISCHARGE

This invention relates to an apparatus for treating the surface of, particularly, a metal substrate by utilizing plasma generated by microwave discharge.

In a known surface-treating apparatus utilizing plasma, a high frequency power of several scores of MHz is supplied to a closed vessel housing a predetermined gas through a coil mounted around the closed vessel. Discharge is caused within the closed vessel by the power supply so as to generate a gas plasma for treating the surface of a desired material. The conventional apparatus of this type gives rise to various drawbacks as described in the following. First of all, the apparatus utilizes a high frequency discharge, with the result that it is difficult to allow the plasma and high frequency oscillator to match with each other. Also, the use of a high frequency discharge brings about a big radiation loss from the discharge chamber to the outside. It follows that it is difficult to efficiently introduce high frequency power into a gas plasma. It should also be noted that a large oscillator and a large power surce are required in order to make up up for the low efficiency. In brief, the conventional apparatus of the type mentioned above is low in efficiency of forming active species within the plasma, such as activated gas and ions, leading to a low treating efficiency or reaction efficiency.

Recently, a chemical dry etching (CDE) apparatus utilizing a microwave discharge has been developed, in which a semiconductor substrate, etc. is etched in a location apart from the plasma region for preventing damage done to the treated material by the plasma. In the CDE apparatus, the etching is performed within the plasma region when the damage done to the treated material by plasma need not be worried about or the material to be treated is intentionally damaged. In this case, plasma is generated in a portion where a vessel penetrates the waveguide of microwave, resulting in the size of the etching section being restricted by the diameter of the waveguide. Therefore, it is impossible to treat a large amount of materials or large size materials. It is also impossible to control the gas pressure in the discharge chamber over a wide range.

An object of this invention is to provide a surface-treating apparatus utilizing plasma generated by microwave discharge, said apparatus being high in treating efficiency and reaction efficiency having a large plasma region for performing the surface treatment, capable of controlling over a wide range the gas pressure within the plasma region, and useful for treating the surfaces of various solid materials.

According to this invention, there is provided an apparatus for treating the surface of a workpiece within a gas plasma generated by microwave discharge, comprising:
a microwave generator,
a waveguide for transmitting the microwave generated from the microwave generator,
a closed vessel housing the material to be treated,
means for introducing a gas into the closed vessel,
means for withdrawing the gas from the closed vessel,
an antenna means inserted at least partially into the closed vessel, said antenna means serving to pick up the microwave from the waveguide and to deliver said microwave into the closed vessel for producing a gas plasma, and
a cylindrical body formed of a microwave-transmitting material, mounted to the closed vessel in an air-tight fashion, and surrounding the antenna means at the portion inserted into the closed vessel.

This invention can be more fully understood from the following detailed description when taken in conjunction with the accompanying drawing, in which:

The appended drawing schematically shows an apparatus for nitriding the surface of a metal substrate according to one embodiment of this invention.

In a surface-treating apparatus of this invention, a microwave transmitted by a waveguide is picked up by an antenna and delivered into a closed vessel so as to generate a plasma within the closed vessel around the antenna. Therefore, the plasma can be generated within a closed vessel of a diameter larger than that of the waveguide. Also, the antenna is disposed within a cylindrical body formed of a microwave-transmitting material so as to prevent the antenna from being exposed to the plasma. This construction is effective for preventing the workpiece material to be treated from being contaminated by the metal sputtered from the antenna and for improving the life of the antenna. It should also be noted that the apparatus of this invention permits controlling over a wide range the gas pressure within the closed vessel.

The accompanying drawing shows an apparatus according to one embodiment of this invention, namely, an apparatus for nitriding a metal surface by utilizing a gas plasma generated by a microwave discharge within a mixture of nitrogen gas and hydrogen gas. As shown in the drawing, a microwave of, for example, 2,400 MHz generated from a microwave generator 1 is transmitted within a waveguide 2 (Japanese Industrial Standard WRJ-2, 109×55 mm). The waveguide 2 is provided with a matching means consisting of a plunger 3 and a three-stub tuner 4 for matching the transmission of microwave. It is seen that a closed vessel 5 sized at, for example, 30 cm in inner diameter and 50 cm in length, which constitutes a plasma producing chamber, is larger in diameter than the waveguide 2. The vessel 5 is formed of a material which does not transmit microwaves, e.g., metals such as stainless steel in order to prevent leakage of microwaves. The use of particular material permits improving the injection efficiency of microwaves into the closed vessel 5. A nonmetallic material coated with a conductive film or covered with a water layer may also be used for forming the closed vessel 5.

The closed vessel 5 is provided with a gas outlet port 6 and a gas inlet port 7. An evacuation means 8 consisting of a diffusion pump 8a, a rotary pump 8b and a cold trap 8c is connected to the outlet port 6 via a valve 9. On the other hand, a nitrogen gas cylinder 12 is connected to the inlet port 7 through a valve 10 and a flow meter 11. A hydrogen gas cylinder 15 is also connected to the inlet port 7 through a valve 13 and a flow meter 14. The closed vessel 5 has a diameter equal to or larger than a half of the wavelength of the microwaves and houses a quartz cylinder 16 sized at, for example, 25 cm in diameter and 30 cm in length. Workpieces 17 are mounted to the inner wall of the quartz cyliner 16. Since quartz is an insulating material, the workpieces 17 are insulated from the closed vessel 5, namely, in an electrically floating condition. An ionization type vacuum indicator 18 for observing the degree of vacuum of the closed vessel 5 in the evacuation step is mounted to the outer wall of the closed vessel 5. Also mounted to the outer wall of the closed vessel 5 is a diaphragm type pressure gauge 19 for observing the pressure of the closed vessel during operation of the apparatus. Further, a cooling coil 20 is wound around the closed vessel 5. Cooling water is circulated through the coil 20 for cooling the closed vessel 5 from the outside.

A copper pipe 21 sized at, for example, 6 mm in outer diameter and 4 mm in inner diameter, which acts as an antenna, is inserted into the waveguide 2. The antenna 21 serves to pick up the microwaves transmitted within the waveguide 2 and to deliver them into the closed vessel 5. A pipe formed of a microwave-transmiting material, e.g., quartz, and having the outer surface covered with a conductive material such as carbon may be used as the antenna 21 in place of a metal pipe. In this case, one end portion of the antenna 21 may not penetrate the waveguide 2 but may be positioned within the waveguide 2. Further, a cylindrical body 22 with a closed end, which houses the antenna 21, is inserted into the central portion of the closed vessel 5. The cylindrical body 22 is formed of a microwave-transmitting material, e.g., quartz, and sized at, for example, 20 mm in outer diameter and 2 mm in wall thickness. As shown in the drawing, the base portion of the cylindrical body 22 is mounted to the bottom portion of the closed vessel 5 in an air-tight fashion by using, for example, O-rings 23. A suitable cooling gas 24, e.g., a non-oxidizing gas such as rare gas or nitrogen gas is passed through the interior space of the antenna 21 so as to cool the antenna 21 and the cylindrical body 22 surrounding the antenna 21. In operating the apparatus of the construction described above, the evacuation means 8 is operated first so as to evacuate the closed vessel 5 and introduce the nitrogen gas and hydrogen gas mixed at a desired ratio into the closed vessel 5. Microwave power is applied to the gas mixture so as to produce a gas plasma 25, thereby nitriding the surface of the workpiece 17. Incidentally, the quartz cylinder 16 with the workpiece 17 mounted to the inner wall thereof also serves to prevent the plasma 25 from being diffused to reach the inner wall of the closed vessel 5. Also, the quartz cylindrical body 22 serves to prevent the antenna 21 from being exposed to the plasma 25.

A nitriding treatment was applied to an alloy steel by using the apparatus shown in the drawing. Specifically, a chip of SACM1 (Japanese Industrial Standard, aluminum chromium molybdenum steel) sized at $15 \times 15 \times 2$ (mm) was mounted as the workpiece 17 to the inner wall of the quartz cylinder 16 as shown in the drawing. Then, the diffusion pump 8a was operated so as to evacuate the closed vessel 5 to a vacuum of $1 \times 10^{-6}$ torr, followed by closing of the valve of the diffusion pump 8a and opening of the valves 10 and 13 so as to introduce nitrogen gas and hydrogen gas into the closed vessel 5, the interior pressure of the closed vessel 5 being about 1.5 torr. In this experiment, the nitrogen gas and hydrogen gas were mixed at a ratio of 1:1, through the mixing ratio differs depending on the object of the nitriding treatment. The rotary pump 8b was operated for withdrawing the gas mixture introduced into the closed vessel 5 via the cold trap 8c bathed in liquid nitrogen, with the withdrawal rate being controlled by the valve 9 such that the gas mixture was allowed to flow through the closed vessel 5 at a flow rate of about 20 cc/min. Further, argon gas coolant was passed through the interior space of the antenna 21.

Under the conditions described above, microwaves of 850 W and 2,450 MHz generated from the microwave generator 1 were applied to the gas mixture within the quartz cylinder 16 so as to produce the gas plasma 25. The plasma 25 served to generate active species such as nitrogen ions, nitrogen-hydrogen molecular ions and various radicals, leading to reaction between the active species and the workpiece 17. The plasma reaction was continued for 2 hours, followed by thermination of the microwave discharge and removal of the sample, with the closed vessel 5 being purged by nitrogen gas. The surface of the treated sample was found to have been turned gray. Further, a metallurgical photomicrograph of a cross section of the treated sample showed that a very hard nitrided layer about 100 to 200$\mu$ thick was uniformly formed on the surface of the sample.

As described above in detail, the surface-treating apparatus of this invention comprises a plasma producing chamber constituted by a closed vessel disposed separately from a waveguide. This construction permits enlarging the plasma region, rendering it possible to treat a large amount of workpieces as well as large size workpieces. Further, a microwave discharge is employed in the apparatus of this invention, rendering it possible to maintain a stable discharge even if the gas pressure within the plasma region is changed over a wide range. It follows that the apparatus of this invention is suitable for various surface treatments of various workpieces including, for example, nitriding treatment, carburizing treatment, etching and plasma reaction. It should be noted in particular that the large discharge space and the use of high frequency microwaves permit a microwave discharge under low pressure such as, for example, $10^{-2}$ to $10^{-3}$ torr. Therefore, the mean free path of the active species such as ions and radicals is enlarged, leading to the generation of a uniform plasma in a large region. As a result, the surface of a workpiece can be treated uniformly.

An additional merit to be noted is that the use of a microwave discharge facilitates matching. Also, the use of a waveguide and metal antenna for transmission of microwaves serves to markedly decrease the electromagnetic radiation loss, leading to a high power efficiency. Further, the apparatus of this invention permits readily applying high power to the plasma, leading to promotion of the treating speed, namely, shortening of the treating time.

In the foregoing embodiment, a nitriding treatment was applied to a metal surface under about 1.5 torr of nitrogen-hydrogen mixture pressure. But, the apparatus of this invention can also be used for treating the surface of polymers such as plastics under a rare gas pressure, e.g., argon gas pressure, or oxygen gas pressure, of about $1 \times 10^{-2}$ torr, and for performing a plasma polymerization using an organic monomer gas so as to form a thin polymer film on a substrate.

What we claim is:

1. An apparatus for treating the surface of a material within a gas plasma generated by microwave discharge, comprising:
    a microwave generator;
    a waveguide for transmitting the microwaves generated from the microwave generator;
    a closed vessel adapted to house at least one workpiece to be treated;
    means for introducing a gas into the closed vessel;

means for withdrawing the gas from the closed vessel;

an antenna means inserted at least partially into the closed vessel, said antenna means serving to pick up the microwave from the waveguide and to deliver said microwave into the closed vessel for producing a gas plasma; and a cylindrical body formed of a microwave-transmitting material, mounted to the closed vessel in an air-tight fashion, and surrounding the antenna means at the portion inserted into the closed vessel.

2. The apparatus according to claim 1, wherein the antenna means is a conductive pipe and the apparatus further comprises means for circulating a cooling gas through the interior space of the conductive pipe for cooling the antenna means and the cylindrical body.

3. The apparatus according to claim 2, wherein one end portion of the conductive pipe is connected to the waveguide and the other end portion is inserted into the closed vessel.

4. The apparatus according to claim 2 or 3, wherein the cooling gas is a non-oxidizing gas.

5. The apparatus according to claim 1, wherein the waveguide is provided with matching means for matching the microwave transmission.

6. The apparatus according to claim 1, wherein the closed vessel is formed of a material which does not transmit microwaves.

7. The apparatus according to claim 1, wherein at least one workpiece to be treated is adapted to be disposed within the closed vessel under an electrically floating condition.

8. The apparatus according to claim 7, wherein at least one workpiece to be treated is adapted to be mounted to the inner wall of an insulated cylinder disposed within the closed vessel.

9. The apparatus according to claim 1, wherein the means for introducing gas into the closed vessel comprises means for introducing nitrogen gas so that the workpiece may be subjected to a nitriding treatment.

10. The apparatus according to claim 9, wherein the means for producing gas into the closed vessel comprises means for introducing a mixture of nitrogen gas and hydrogen gas.

* * * * *